(12) United States Patent
Kapteyn et al.

(10) Patent No.: US 7,402,860 B2
(45) Date of Patent: Jul. 22, 2008

(54) METHOD FOR FABRICATING A CAPACITOR

(75) Inventors: Christian Kapteyn, Dresden (DE); Stephan Kudelka, Dresden (DE); Thomas Hecht, Dresden (DE)

(73) Assignee: Infineon Technologies AG, Munich (DE)

( * ) Notice: Subject to any disclaimer, the term of this patent is extended or adjusted under 35 U.S.C. 154(b) by 175 days.

(21) Appl. No.: 11/179,052

(22) Filed: Jul. 11, 2005

(65) Prior Publication Data
US 2007/0007624 A1    Jan. 11, 2007

(51) Int. Cl.
*H01L 27/108* (2006.01)
(52) U.S. Cl. .................... 257/301; 257/302; 257/303; 257/304; 257/E29.346
(58) Field of Classification Search ......... 257/301–304, 257/E29.346
See application file for complete search history.

(56) References Cited

U.S. PATENT DOCUMENTS

| | | | |
|---|---|---|---|
| 6,200,851 B1 * | 3/2001 | Arnold ..................... | 438/243 |
| 6,693,016 B2 | 2/2004 | Gutsche et al. | |
| 6,838,334 B1 * | 1/2005 | Gluschenkov et al. ...... | 438/243 |
| 2005/0212027 A1 * | 9/2005 | Adam et al. ................ | 257/302 |

* cited by examiner

*Primary Examiner*—Matthew E Warren
(74) *Attorney, Agent, or Firm*—Slater & Matsil, L.L.P.

(57) ABSTRACT

The present invention relates to a method of fabricating a capacitor in a semiconductor substrate. The capacitor is fabricated such that the capacitor comprises: a trench inside a substrate, the trench having a lower region and an upper region, wherein the trench's diameters in the lower region is larger than in the upper region; a first electrode; a dielectric layer on top of the first electrode; a conductive layer on top of the electric layer, the conductive layer forming a second electrode of the capacitor; and a plug forming a closed cavity inside the lower region.

21 Claims, 6 Drawing Sheets

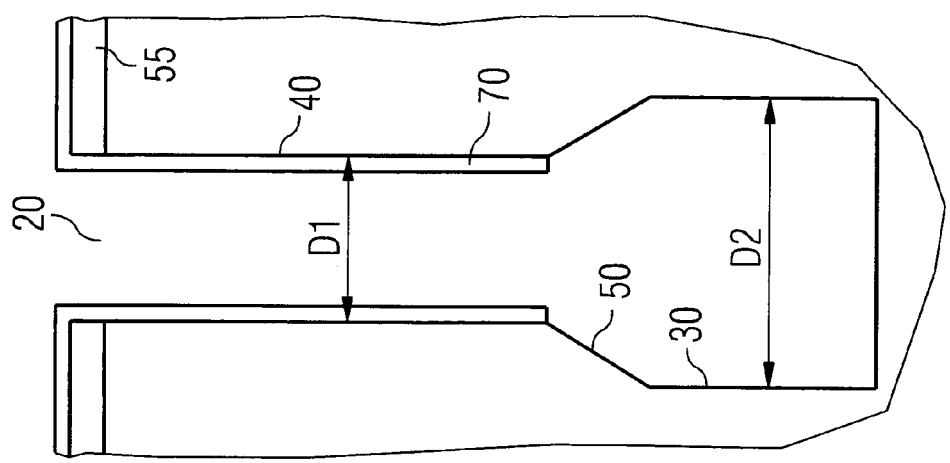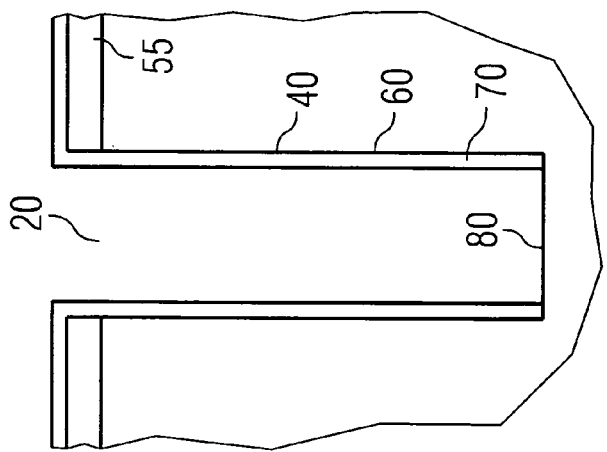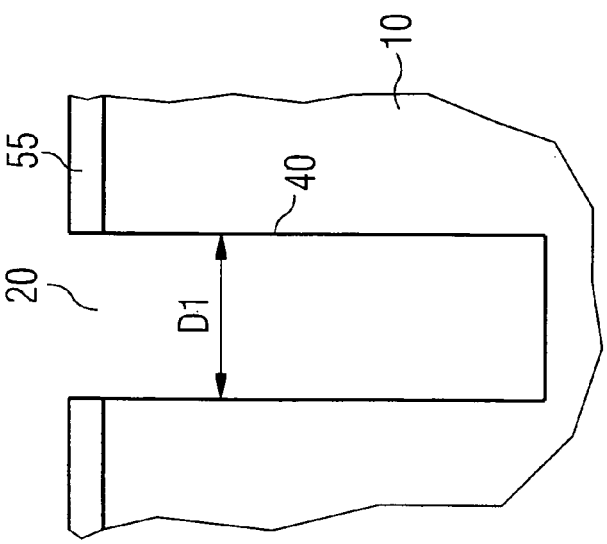

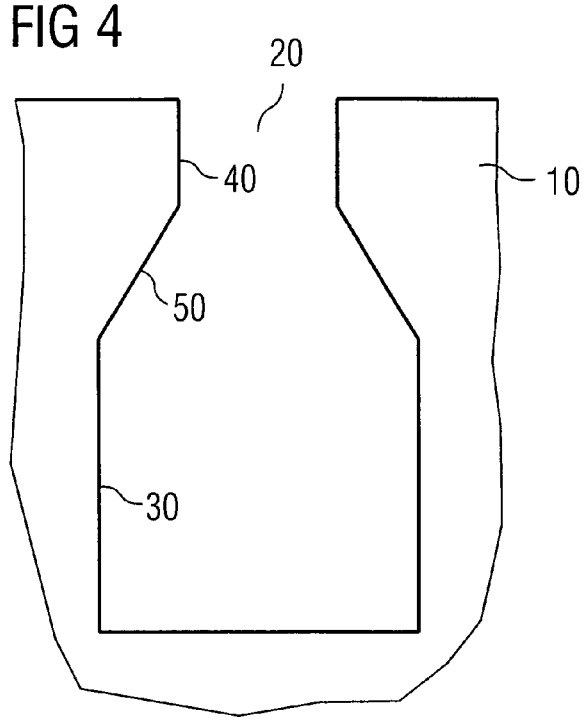
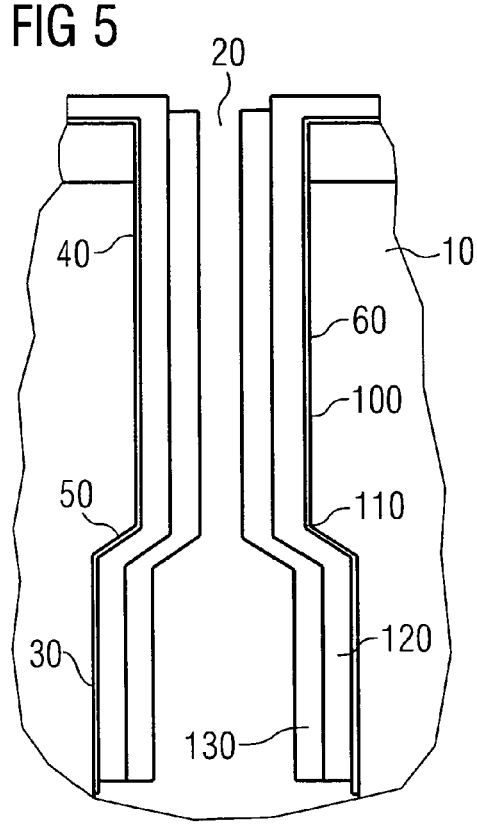
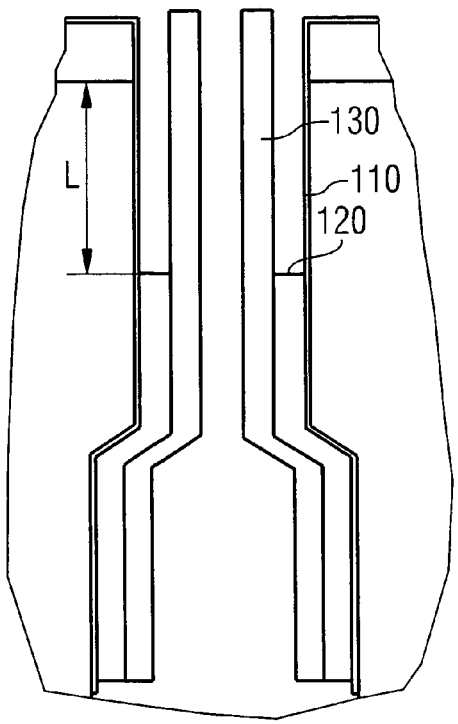

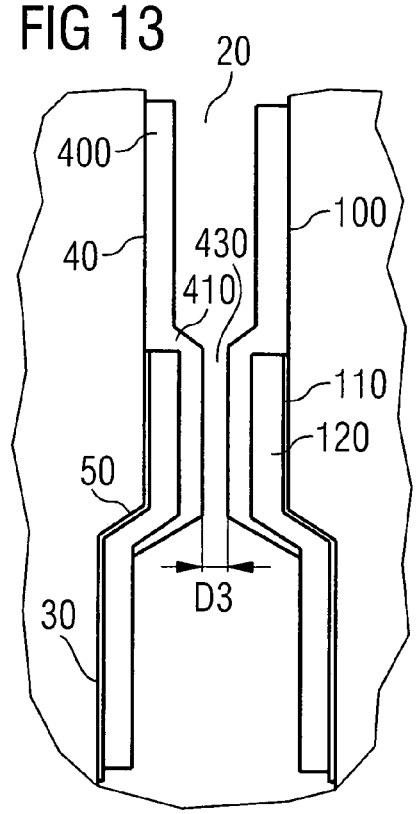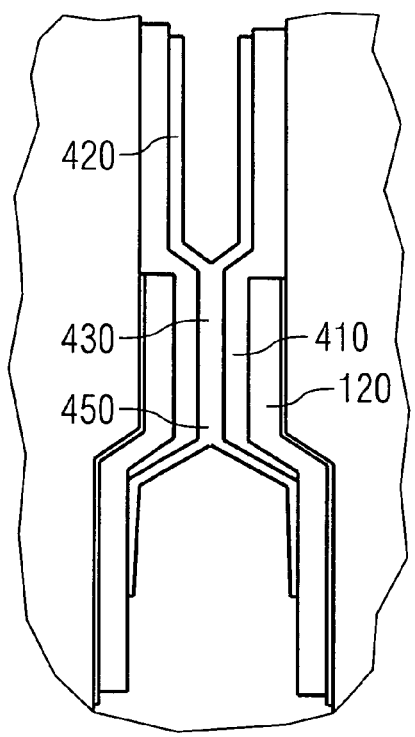

METHOD FOR FABRICATING A CAPACITOR

TECHNICAL FIELD

The present invention relates to a method of fabricating a capacitor in a semiconductor substrate. More specifically, the present invention relates to so-called MIS (Metal Insulator Semiconductor) structures or MIM (Metal Insulator Metal) structures.

BACKGROUND

A method of fabricating a capacitor in a semiconductor substrate is described in U.S. Pat. No. 6,693,016, which is incorporated herein by reference. The capacitor according to this patent comprises a dielectric layer with a relatively high dielectric constant and metallic electrode layers to avoid space charge regions.

Prior art methods of fabricating capacitors in a substrate induce a significant mechanical stress inside the substrate's surface. Due to this mechanical stress, the substrate may bow. Substrates such as wafers of large diameters are difficult to handle and to further process if they are bent or non-planar.

SUMMARY OF THE INVENTION

According to embodiments of the present invention, a trench having a lower region and an upper region is formed in the substrate. The trench's diameter is larger in the lower region and smaller in the upper region. A first electrode of the capacitor is formed inside the trench. If the first electrode is created by the substrate itself, the first electrode is automatically formed during the etch process of the trench. Alternatively, the first electrode may be realized by depositing an additional electrode layer (e.g., a metallic layer) onto the trench's sidewalls. Afterwards, a dielectric layer and a conductive layer are deposited. The deposited conductive layer forms a second electrode of the capacitor. The upper region of the trench is closed by a plug, thereby forming a closed cavity inside the lower region. Then, a contact layer is deposited that contacts the second electrode.

According to embodiments of the invention, a cavity is formed in the lower region of the capacitor. The cavity remains empty, so no material is filled therein. As the cavity does not contain material, it will not induce any stress inside the substrate's surface. The plug on top of the cavity allows to smooth the resulting surface and to create a planar surface for further processing. In contrast thereto, prior art capacitors are filled completely with material in order to create a planar surface. These fillings, however, induce stress inside the surface as described above.

In summary, embodiments of the invention significantly avoid stress inside the substrate by leaving the trench at least partly empty. The trench is closed on top in order to allow for further processing of the substrate. For example, dynamic random access memory (DRAM) or similar devices may be fabricated during further process steps as known in the art.

Preferably, the cross-section of the trench is formed like a bottle such that the upper region of the trench forms a bottleneck.

According to a first preferred embodiment of the invention, the contact layer is deposited on the second electrode above the plug. The plug may consist of insulating material.

The trench may be closed such that an upper part of the second electrode above the plug remains uncovered. In this case, the contact layer may be deposited directly on the upper part of the second electrode.

The closing of the upper region may include depositing an insulating layer at least in the upper region, and thereafter removing the insulating layer in the upper part of the second electrode.

According to a second preferred embodiment of the invention, the contact layer is deposited on the second electrode below the plug.

The upper region may be closed by firstly forming an outer plug ring consisting of insulating material. Then the contact layer is deposited through the plug ring opening onto the second electrode.

Preferably, the outer plug ring is formed by depositing a non-conformal layer of insulating material such that the upper region will narrow.

In order to facilitate the deposition of the contact layer on the second electrode below the plug, the non-conformal layer of insulating material is deposited such that the lower region of the trench remains at least partly uncovered.

Another aspect of the invention is directed to a capacitor formed inside a substrate.

With regard to such a capacitor, one aspect of the invention is to provide a capacitor with reduced mechanical stress inside the surface of the substrate.

According to embodiments of the invention, the capacitor comprises a trench formed inside a substrate, the trench having a lower region and an upper region, wherein the trench's diameter in the lower region is larger than in the upper region. A plug closes the lower region forming a closed cavity.

BRIEF DESCRIPTION OF THE DRAWINGS

In order that the manner in which the above-recited and other advantages of the invention are obtained will be readily understood, a more particular description of the invention briefly described above will be rendered by reference to specific embodiments thereof, which are illustrated in the appended drawings. Understanding that these drawings depict only typical embodiments of the invention and are not, therefore, to be considered to be limiting of its scope, the invention will be described and explained with additional specificity and detail through the use of the accompanying drawings in which:

FIGS. 1-12 illustrate a first embodiment of the inventive method, wherein a contact layer contacts a second electrode layer above a plug; and FIGS. 1-7 and 13-16 illustrate a second embodiment of the inventive method wherein a contact layer contacts a second electrode layer below a plug.

The preferred embodiments of the present invention will be best understood by reference to the drawings, wherein like parts are designated by like numerals throughout.

Figure 7:
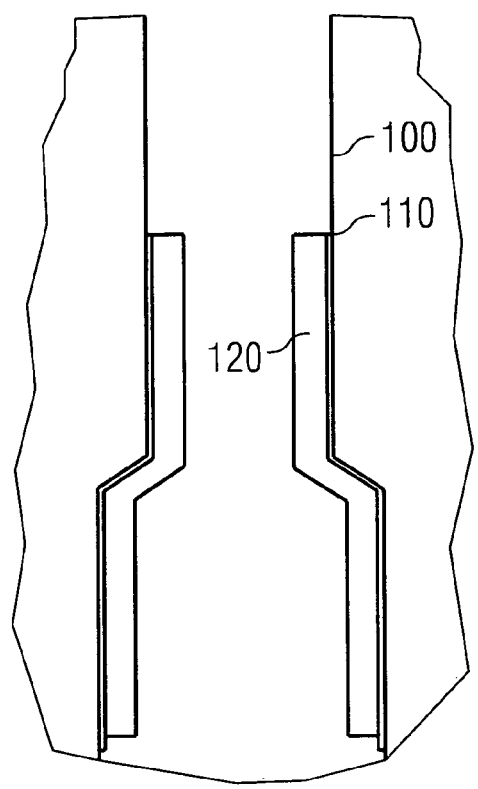

The following list of reference symbols can be used in conjunction with the figures:

10 silicon substrate
20 trench
30 lower region
40 upper region
50 transition region
55 mask
60 sidewall
70 etch mask
80 bottom
100 first conductive layer
110 dielectric layer
120 second conductive layer
130 oxide layer
190 sacrificial polysilicon 200 non-conformal oxide layer
210 upper part of the lower region
220 plug
230 cavity
240 upper part of the second electrode layer
250 contact layer
260 polysilicon
270 TiN-material
400 non-conformal oxide layer
410 outer plug ring
420 conformal contact layer
430 plug ring opening
450 plug
500 polysilicon
510 TiN-material

DETAILED DESCRIPTION OF ILLUSTRATIVE EMBODIMENTS

It will be readily understood that the process steps of the present invention, as generally described and illustrated in the figures herein, could vary in a wide range of different process steps. Thus, the following more detailed description of the embodiments of the present invention, as represented in FIGS. 1-16, is not intended to limit the scope of the invention as claimed, but is merely representative of presently preferred embodiments of the invention.

Embodiments of the present invention provide a method for fabricating a capacitor in a semiconductor substrate. Referring to FIG. 4, a silicon substrate 10 is illustrated. A trench 20 is etched inside the substrate 10 such that a bottle-like cross-section results. The trench 20 comprises a lower region 30, an upper region 40 and a transition region 50 that connects the upper region 40 and the lower region 30.

The bottle-like trench 20 as shown in FIG. 4 can be fabricated in many ways. For example, in a first etch step, the upper region 40 is etched using an anisotropic etch gas and a mask 55 (see FIG. 1). The diameter of the trench 20 is designated by reference numeral D1. Then, the sidewalls 60 of the upper region 40 are covered with an etch mask 70. The etch mask 70 is removed from the bottom 80 of the trench 20 by an anisotropic etch step (FIG. 2).

Subsequently, the bottom 80 is further etched down using an isotropic etch gas. The isotropic etch gas broadens the trench below the etch mask 70 such that the lower region 30 with a larger diameter D2 results (see FIG. 3). Of course, the trench structure according to FIG. 4 may be fabricated in any other way known in the art. For example, the trench could be etched anisotripically to its final depth. Subsequently, a non-conformal etch mask layer is deposited in the upper region of the trench leaving the lower trench region unmasked. Then the resulting structure is broadened in the unmasked lower trench region using an isotropic etch step.

The trench 20 according to FIG. 4 is further processed by depositing a first conformal conductive layer 100 on the trench's sidewalls 60 (see FIG. 5). This conductive layer 100 forms a first electrode (layer) of the capacitor. The conductive layer 100 may be insulated from the substrate 10 by an additional insulation layer that is not depicted in the figures for the purpose of clarity.

Subsequently, a conformal dielectric layer 110 (e.g., an oxide layer), a second conformal conductive layer 120 and a conformal oxide layer 130 are deposited on the substrate 10. The resulting structure is shown in FIG. 5. The second conductive layer 120 provides a second electrode (layer) of the capacitor.

Then, the second conductive layer 120 is etched down to a predetermined depth L as shown in FIG. 6. Both oxide layers 110 and 130 remain unchanged during this etch step.

Subsequently, an oxide etch step is carried out. During this etch step, the conformal oxide layer 110 is removed partly and the conformal oxide layer 130 is removed completely. The conformal oxide layer 110 just remains below the conformal conductive layer 120. The resulting structure is depicted in FIG. 7.

Figure 8:
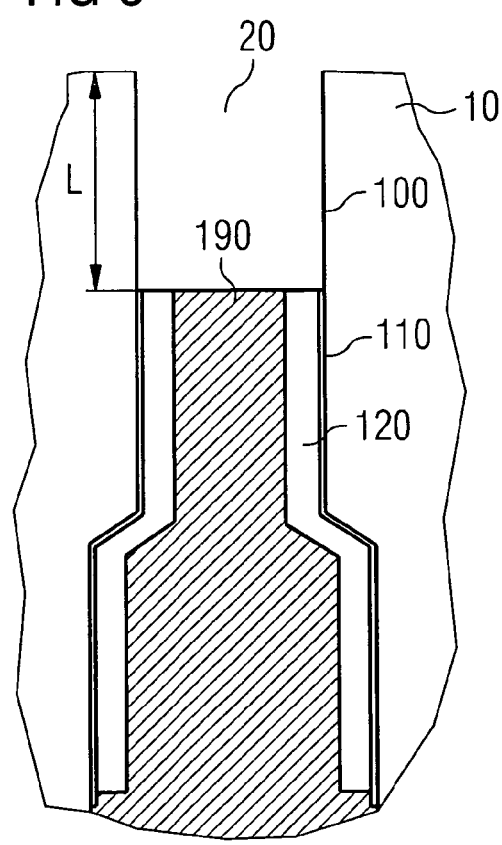

Starting from the structure as shown in FIG. 4, the structure according to FIG. 7 may also be fabricated in another way. For example, after depositing a first conformal conductive layer 100, a conformal dielectric layer 110 and a second conformal conductive layer 120, the trench may be filled with sacrificial polysilicon 190 (FIG. 8). Then the conformal dielectric layer 110, the second conformal conductive layer 120 and the sacrificial polysilicon 190 are etched down to the predetermined depth L. Subsequently, the sacrificial polysilicon 190 is completely removed. The resulting structure is identical to the structure as shown in FIG. 7.

Figure 11:
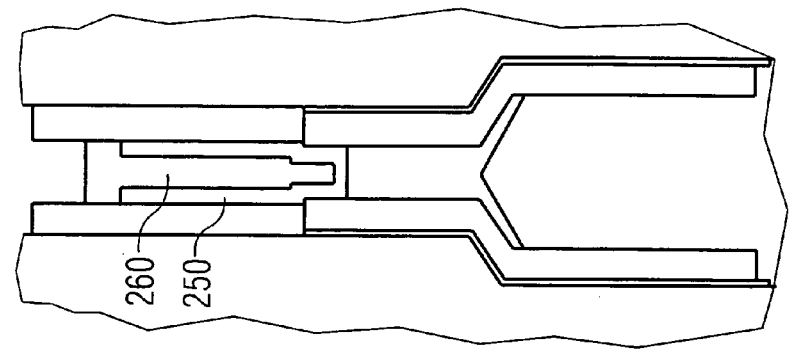
Figure 10:
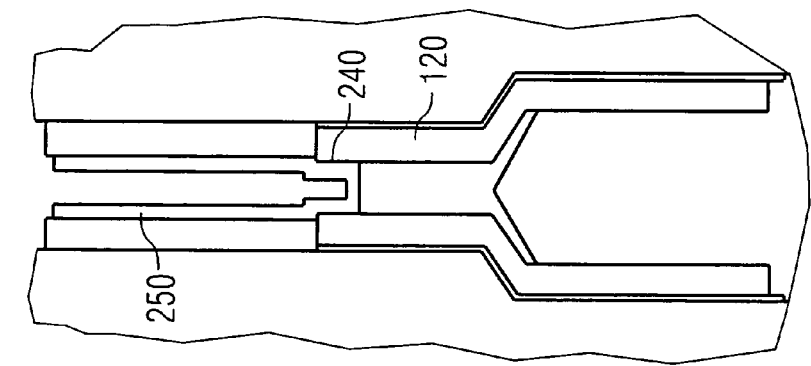
Figure 9:
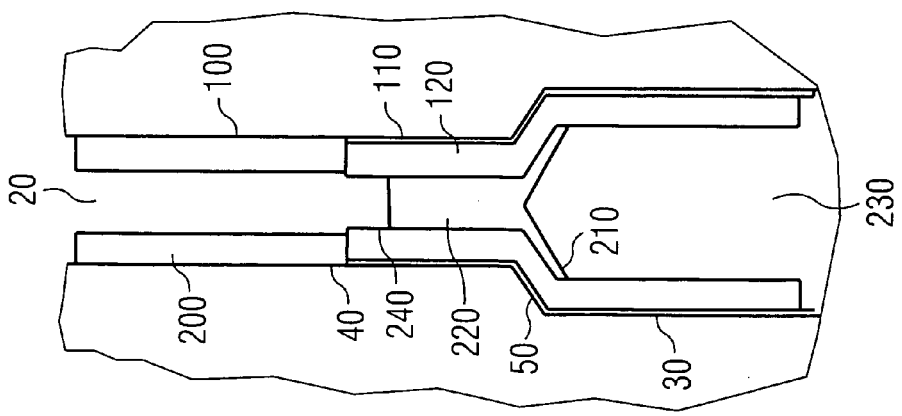

FIGS. 9-11 further illustrate a first preferred embodiment of the inventive method. According to this embodiment and starting from the structure according to FIG. 7, a non-conformal oxide layer 200 (e.g., 15 nm silicon oxide) is deposited. This non-conformal oxide layer 200 just covers the upper region 40, the transition region 50 and the upper part 210 of the lower region 30 of the trench 20. The non-conformal oxide layer 200 provides a plug 220 that closes the upper region 40 and separates the upper region 40 from the lower region 30. Therefore, a closed cavity 230 is formed inside the lower region.

Then, the non-conformal oxide layer 200 is etched using an anisotropic etch gas such that layer 200 is removed from an upper part 240 of the second electrode layer 120. The resulting structure is shown in FIG. 9.

Figure 12:
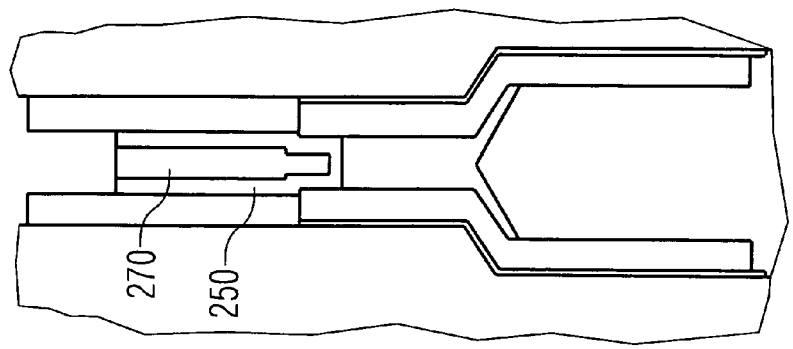

Afterwards, a contact layer 250 is deposited on the upper part 240 of the second electrode layer 120 (FIG. 10). The contact layer 250 may be filled with conductive polysilicon material 260 as shown in FIG. 11 or alternatively with conductive TiN-material 270 as shown in FIG. 12.

According to the first embodiment of the invention, the upper region 40 of the trench 20 is closed completely by the non-conductive plug 220. Therefore, the contact layer 250 is deposited above the plug 220 on the second electrode layer 120.

FIGS. 13-16 illustrate a second preferred embodiment of the invention. According to this second embodiment, a non-conformal oxide layer 400 is deposited on the structure as discussed above with regard to FIG. 7. In contrast to the first embodiment of the invention, the non-conformal oxide layer 400 (e.g., 15 nm silicon oxide) does not completely close the upper region 40, it just narrows the upper region 40 to a smaller diameter D3. In this way, an outer plug ring 410 consisting of oxide material is realized. The lower region 30 of the trench 20 remains uncovered from layer 400.

Then, a conformal contact layer 420 is deposited through the plug ring opening 430 onto the second electrode layer 120 inside the lower region 30 of the trench 20. As the lower region 30 is at least partly uncovered from layer 400, the conformal contact layer 420 will create an electrical contact to the second electrode layer 120 below the plug ring 410.

Due to the small diameter D3 of the plug ring opening 430, the conformal contact layer 420 closes the plug ring opening 430 and forms—together with the plug ring 410—a plug 450 that separates the lower region 30 from the upper region 40 of the trench 20. Accordingly, a cavity 230 is formed inside the lower region 30 of the trench 20 (FIG. 14).

Figure 15:
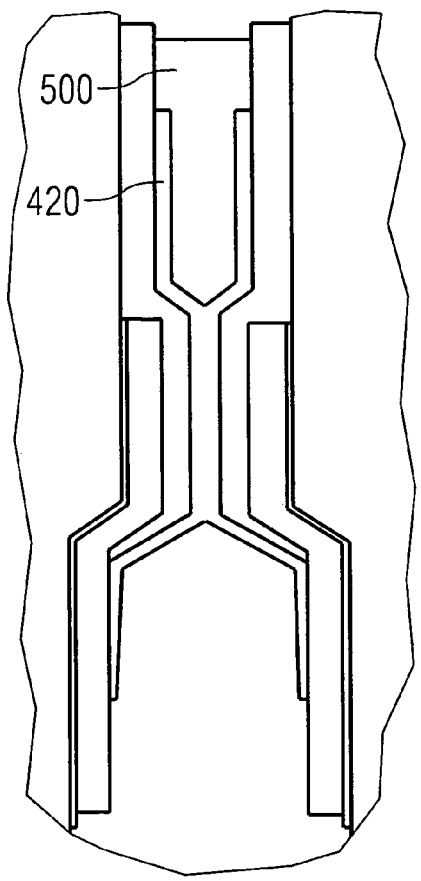
Figure 16:
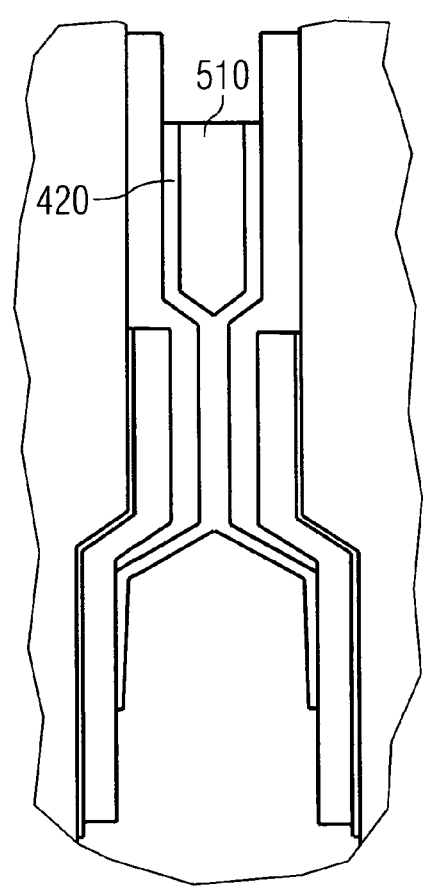

The conformal contact layer 420 may be filled with conductive polysilicon material 500 as shown in FIG. 15 or with conductive TiN-material 510 as shown in FIG. 16.

What is claimed is:

1. A capacitor comprising:
   a trench inside a substrate, the trench having a lower region and an upper region, wherein the trench has a diameter in the lower region that is larger than a diameter in the upper region;
   a first electrode layer inside the trench and along sidewalls thereof;
   a dielectric layer over the first electrode layer;
   a conductive layer over the dielectric layer, the conductive layer forming a second electrode of the capacitor, the conductive layer extending from the lower region into the upper region of the trench; and
   a plug comprising a insulative portion, the plug contacting a side of the second electrode, the plug forming a closed cavity inside the lower region.

2. The capacitor according to claim 1, wherein the trench has a cross-section that is formed like a bottle and the upper region of the trench forms a bottleneck of said bottle.

3. The capacitor according to claim 1, wherein a contact layer contacts the second electrode above the plug.

4. The capacitor according to claim 3, wherein the plug comprises an insulating material.

5. The capacitor according to claim 1, wherein a contact layer contacts the second electrode below the plug.

6. The capacitor according to claim 5, wherein the plug comprises an outer plug ring comprising an insulating material, the plug ring having a plug ring opening and wherein the contact layer penetrates and closes the plug ring opening and contacts the second electrode below the plug ring.

7. The capacitor according to claim 6, wherein the contact layer is filled with a conductive material.

8. The capacitor according to claim 6, wherein the contact layer is filled with TiN.

9. The capacitor according to claim 6, wherein the contact layer is filled with conductive polysilicon.

10. The capacitor according to claim 3, wherein the contact layer at least partially lines the trench above the plug, contacting the second electrode layer.

11. The capacitor according to claim 10, wherein a contact interface between the contact layer and the second electrode layer is vertical at least in parts.

12. The capacitor according to claim 3, wherein the contact layer above the plug is at least partially filled with a conductive material.

13. The capacitor according to claim 12, wherein the conductive material comprises polysilicon or TiN.

14. The capacitor according to claim 3, wherein the plug separates a cavity in the lower region of the trench from the upper part.

15. The capacitor according to claim 5, wherein the contact layer at least partially lines the trench below the plug thereby contacting the second electrode layer.

16. The capacitor according to claim 15, wherein a contact interface between the contact layer and the second electrode layer is vertical at least in parts.

17. The capacitor according to claim 5, wherein the contact layer above the plug is at least partially filled with a conductive material.

18. The capacitor according to claim 17, wherein the conductive material comprises polysilicon or TiN.

19. The capacitor according to claim 5, wherein the plug separates a cavity in the lower region of the trench from the upper part.

20. A capacitor comprising:
    a trench inside a substrate, the trench having a lower region and an upper region, wherein the trench has a cross-section that is formed like a bottle and the upper region of the trench forms a bottleneck of said bottle such that the trench has a diameter in the lower region that is larger than a diameter in the upper region;
    a first electrode layer along sidewalls of the trench;
    a dielectric layer over the first electrode layer;
    a conductive layer over the dielectric layer, the conductive layer forming a second electrode of the capacitor, the conductive layer of the second electrode extending from the lower region into the upper region of the trench;
    a plug contacting a side of the second electrode, the plug forming a closed cavity inside the lower region and separating a cavity in the lower region of the trench from the upper part, wherein the plug comprises an insulating material; and
    a contact layer contacting the second electrode, wherein the contact layer at least partially lines the trench above the plug, wherein a contact interface between the contact layer and the second electrode layer is vertical at least in parts, and wherein the contact layer above the plug is at least partially filled with a conductive material.

21. A capacitor comprising:
    a trench inside a substrate, the trench having a lower region and an upper region, wherein the trench has a cross-section that is formed like a bottle and the upper region of the trench forms a bottleneck of said bottle such that the trench has a diameter in the lower region that is larger than a diameter in the upper region;
    a first electrode layer on sidewalls of the trench;
    a dielectric layer over the first electrode layer;
    a conductive layer over the dielectric layer, the conductive layer forming a second electrode of the capacitor, the conductive layer of the second electrode extending from the lower region into the upper region of the trench;
    a plug contacting a side of the second electrode, the plug forming a closed cavity inside the lower region, wherein the plug comprises an outer plug ring comprising an insulating material, the plug ring having a plug ring opening; and
    a contact layer contacting the second electrode below the plug, wherein the contact layer penetrates and closes the plug ring opening and contacts the second electrode below the plug ring, wherein the contact layer at least partially lines the trench below the plug thereby contacting the second electrode layer, wherein a contact interface between the contact layer and the second electrode layer is vertical at least in parts, and wherein the contact layer above the plug is at least partially filled with a conductive material.

* * * * *